(12) United States Patent
Yamaguchi et al.

(10) Patent No.: US 9,167,876 B2
(45) Date of Patent: Oct. 27, 2015

(54) WATERPROOFING CASE AND METHOD OF MANUFACTURING WATERPROOFING CASE

(71) Applicant: FUJITSU LIMITED, Kawasaki-shi, Kanagawa (JP)

(72) Inventors: Shingo Yamaguchi, Kawasaki (JP); Satoshi Watanabe, Setagaya (JP); Satoshi Kanbayashi, Kawasaki (JP); Yasuhiro Ite, Chofu (JP); Hayato Shida, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/108,841

(22) Filed: Dec. 17, 2013

(65) Prior Publication Data
US 2014/0238980 A1    Aug. 28, 2014

(30) Foreign Application Priority Data
Feb. 28, 2013    (JP) .................. 2013-039899

(51) Int. Cl.
A45C 11/22    (2006.01)
A45C 13/00    (2006.01)
A45C 11/00    (2006.01)
B65D 53/06    (2006.01)
H05K 5/06    (2006.01)

(52) U.S. Cl.
CPC ............... *A45C 13/008* (2013.01); *A45C 11/22* (2013.01); *B65D 53/06* (2013.01); *H05K 5/061* (2013.01); *A45C 2011/002* (2013.01); *Y10T 29/49826* (2015.01)

(58) Field of Classification Search
USPC ............... 220/4.21, 4.22, 378, 784, 788, 560, 220/212, 795, 310.1, 849, 345.6, 806, 614, 220/681; 206/811, 320, 701–728, 305; 224/934
See application file for complete search history.

(56) References Cited

U.S. PATENT DOCUMENTS

| 1,986,057 | A | * | 1/1935 | Hackworth | 220/849 |
| 4,298,204 | A | * | 11/1981 | Jinkins | 277/641 |
| 5,050,764 | A | * | 9/1991 | Voss | 220/378 |
| 5,125,531 | A | * | 6/1992 | Wentz | 220/849 |
| 6,131,760 | A | * | 10/2000 | Huang | 220/526 |

FOREIGN PATENT DOCUMENTS

| JP | H9-267689 A | 10/1997 |
| JP | 2002-286143 A | 10/2002 |
| JP | 2004-108469 A | 4/2004 |
| KR | 10-2009-0021562 A | 3/2009 |

OTHER PUBLICATIONS

Korean Office Action, with full English language translation, dated Dec. 1, 2014, for corresponding Korean Patent Application No. 10-2014-0002255.

* cited by examiner

*Primary Examiner* — Fenn Mathew
*Assistant Examiner* — Jennifer Castriotta
(74) *Attorney, Agent, or Firm* — Squire Patton Boggs (US) LLP

(57) ABSTRACT

A waterproofing case with a first case and a second case includes a non-annular groove that has a start point side and an end point side and is arranged in parallel by a barrier rib of a certain length, in one of annular bonding portions. The waterproofing case also includes a cutout portion provided at a middle portion of the barrier rib so as to allow a groove portion at the start point side and the end point side to communicate with each other and a plastic elastomer that is disposed within the non-annular groove by curing after being coated. Furthermore, the waterproofing case includes a protrusion that bisects an exposed portion of the plastic elastomer disposed within the non-annular groove toward opposite walls of the non-annular groove at bonding two cases, in other annular bonding portion of the first case and the second case.

15 Claims, 13 Drawing Sheets

WATERPROOFING CASE AND METHOD OF MANUFACTURING WATERPROOFING CASE

CROSS-REFERENCE TO RELATED APPLICATION

This application is based upon and claims the benefit of priority from the prior Japanese Patent Application No. 2013-039899 filed on Feb. 28, 2013, the entire contents of which are incorporated herein by reference.

FIELD

The present application relates to a waterproofing case and a method of manufacturing the waterproofing case.

BACKGROUND

A device case of a portable electric device that may be used outdoors is conventionally provided with a waterproofing structure ("waterproofing case") in order to prevent infiltration of moisture such as rainwater into the inside of the device case. When the electronic device case is bisected into a first case and a second case, the waterproofing case may be realized by inserting a linear elastic body into a fitting portion ("bonding portion") of the first case and the second case without a gap. The linear elastic body which is inserted into the bonding portion of the first case and the second case may be either a continuous loop type elastic body or a discontinuous type elastic body which is discontinued at a middle portion thereof. The discontinuous type elastic body has a configuration in which the opposite ends of the elastic body are brought close to each other so that water may not infiltrate therefrom.

The continuous loop type elastic body is required to be fabricated according to the lengths of the bonding portions of the first case and the second case. Thus, when the shapes of the first and second cases and the lengths of the bonding portions of the first case and the second case are changed due to a design change, it is required to change the specification of the elastic body. Whereas, the discontinuous type elastic body may flexibly comply with a design change since the length of the elastic body may be readily changed even if the shapes of the cases and the lengths of the bonding portions of the first case and the second case are changed.

In the conventional technology, as for a material for the elastic body, a plastic resin such as a thermoplastic resin may be employed instead of a natural rubber or a synthetic rubber. The thermoplastic resin refers to a resin that is softened to exhibit fluidity when heated and changed into an elastic body when cooled. The thermoplastic resin may comply with various shape of the bonding portions when it is coated on the bonding portions of the first case and the second case. In addition, since the thermoplastic resin itself has adhesiveness, there are little restrictions on design even if a groove configured to allow the thermoplastic resin to extend to a waterproofing route is only partially provided. In order to cure the resin that exhibits fluidity, for example, mixing of two kinds of resins may be considered, except cooling the resin.

The waterproofing structure in which a thermoplastic resin that exhibits fluidity is coated on the boding portions of the first case and the second case also requires a structure in which the coating start point and coating finish point of the thermoplastic resin are brought close to each other to be subjected to a waterproofing processing. However, the following problems may be caused. When both the top surfaces of the solidified elastic bodies at the coating start point and coating finish point of the thermoplastic resin are pressed, the thermoplastic resin may stick out of a side surface of the case deteriorating the external appearance of the case. In order to avoid the thermoplastic resin sticking out of the case, it is required to precisely control the coating amount of the thermoplastic resin coated on the bonding portions of the first case and second case. However, the precise control of the coating amount is not easy and may cause a decline in yield.

The related art is disclosed in Japanese Laid-open Patent Publication No. 2004-108469.

SUMMARY

According to an aspect of the present disclosure, a waterproofing case that has a first case and a second case each including an annular bonding portion, the waterproofing case includes a non-annular groove that has a start point side and an end point side and is arranged in parallel by a barrier rib of a certain length, in one of annular bonding portions of the first case and the second case. The waterproofing case also includes a cutout portion that is provided at a middle portion of the barrier rib so as to allow a groove portion at the start point side and the groove portion at the end point side to communicate with each other and a plastic elastomer that is disposed within the non-annular groove by curing after being coated. Furthermore, the waterproofing case includes a protrusion that does not arrive at a bottom of the non-annular groove and bisects an exposed portion of the plastic elastomer disposed within the non-annular groove toward opposite walls of the non-annular groove when the first case and the second case are bonded to each other, in other annular bonding portion of the first case and the second case. And the linear protrusion is continued to cross the barrier rib at a position of the cutout portion.

The object and advantages of the disclosure will be realized and attained by means of the elements and combinations particularly pointed out in the claims. It is to be understood that both the foregoing general description and the following detailed description are exemplary and explanatory, and are not restrictive of the disclosure as claimed.

BRIEF DESCRIPTION OF DRAWINGS

FIG. 6A is a partial enlarged cross-sectional view illustrating a second embodiment in which the side surfaces and the bottom of the groove are connected at curved surfaces, FIG. 6B is a partial enlarged cross-sectional view illustrating a third embodiment in which the bottom of the groove is a curved surface in its entirety, FIG. 6C is a partial enlarged cross-sectional view illustrating a fourth embodiment in which the bottom of the groove is a circumferential surface, FIG. 6D is a partial enlarged cross-sectional view illustrating a modified example in which the groove wall at the inner side of the case of the second embodiment illustrated in FIG. 6A is formed to be low, FIG. 6E is a partial enlarged cross-sectional view illustrating a modified example in which the groove wall at the inner side of the case of the third embodiment illustrated in FIG. 6B is formed to be low, and FIG. 6F is a partial enlarged cross-sectional view illustrating a modified example in which the groove wall at the inner side of the case of the fourth embodiment illustrated in FIG. 6C is formed to be low.

FIG. 7A is a partial enlarged cross-sectional view illustrating a second embodiment in which the inner circumferential surface and the end surface of the external wall of the bonding portion are connected at a curved surface, FIG. 7B is a partial enlarged cross-sectional view illustrating a third embodiment in which the end surface of the bonding portion is a curved surface, and FIG. 7C is a partial enlarged cross-sectional view illustrating a fourth embodiment in which the end surface of the bonding portion is a circumferential surface.

DESCRIPTION OF EMBODIMENTS

Hereinafter, examples of the present disclosure will be described in detail with reference to the drawings.

Figure 1:
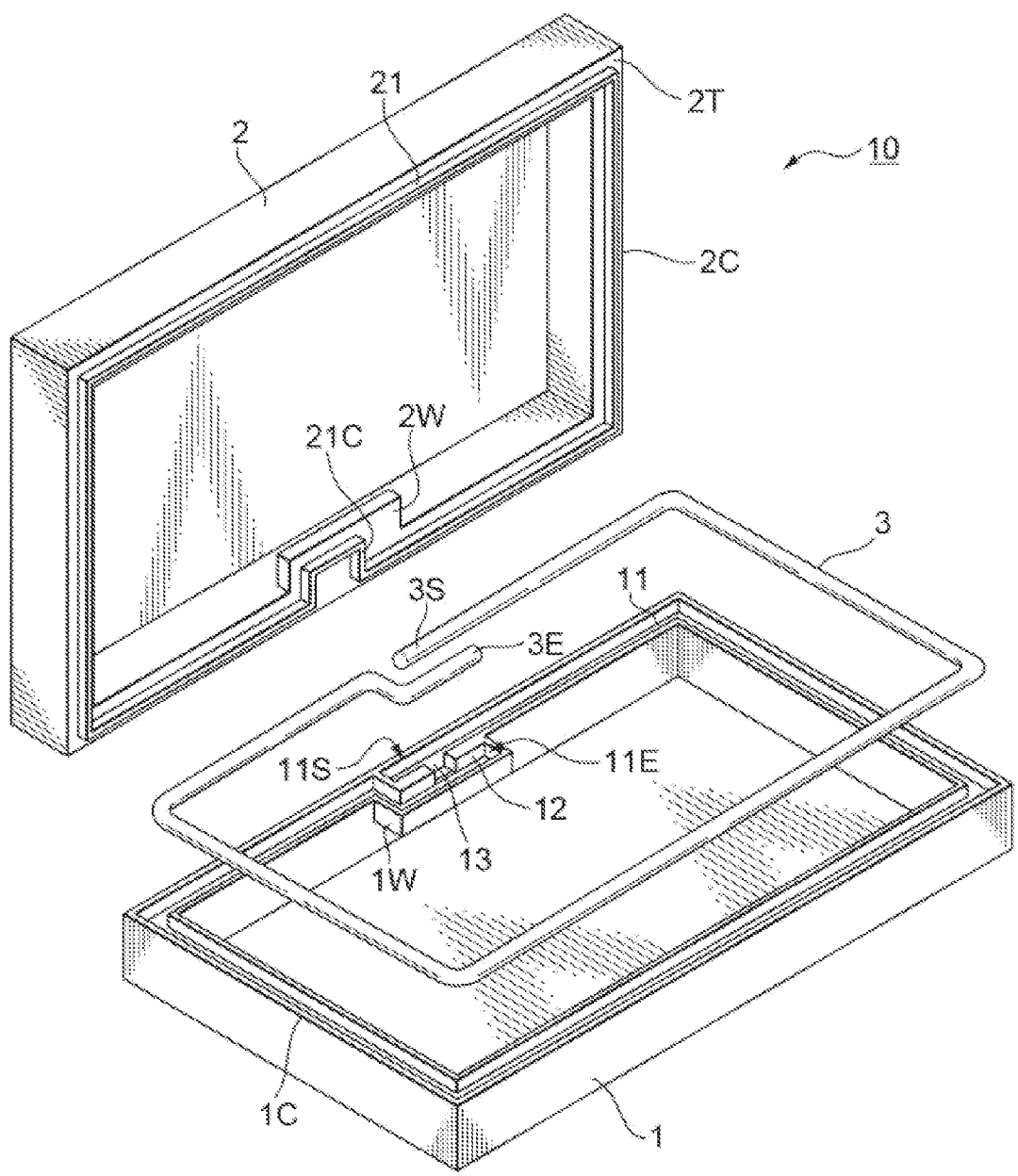
FIG. 1 is an exploded perspective view illustrating a first type waterproofing case according to the present disclosure.

FIG. 1 illustrates an example for describing a waterproofing structure of a first type waterproofing case 10 according to the present disclosure. In the embodiment illustrated in FIG. 1, the waterproofing structure portion is depicted in an enlarged size rather than in a practical size in order to describe the waterproofing structure of the first type waterproofing case 10. The first type waterproofing case 10 includes a first case 1 and a second case 2. The first type waterproofing case 10 is formed by fitting a bonding portion 1C of the first case 1 and a bonding portion 2C of the second case 2 to each other. In addition, the waterproofing structure of the waterproofing case 10 is provided at the bonding portion 1C of the first case 1 and the bonding portion 2C of the second case 2.

In the first type waterproofing case 10, the annular bonding portion 1C of the first case 1 is provided with a non-annular groove 11 having a start point and an end point. The term, "non-annular" indicates that the groove 11 is not continuous, and has a start point and an end point. In the present embodiment, an expanded portion 1W is provided at a portion of the annular bonding portion 1C of the first case 1 to make the width of the bonding portion 1C bulge to the inside, and the start point 11S of the groove 11 and the end point 11E of the groove 11 are disposed in parallel to each other in the expanded portion 1W. In the present embodiment, the end portion of the groove 11 where the outer expanded portion 1W is disposed is referred to as the start point 11S, and the end of the groove 11 where the inner expanded portion 1W is disposed is referred to as the end point 11E. However, the terms such as the start point and the end point are used merely for the convenience of description, and any of the ends may be referred to as a start point as well. Further, the expanded portion 1W may be disposed at any position in the annular bonding portion 1C of the first case 1.

A barrier rib 12 with a predetermined length is provided between the start point 11S and the end point 11E of the groove 11 which are arranged in parallel to each other in the expanded portion 1W. The length and width of the barrier rib 12 are not particularly limited. In addition, at a middle portion of the barrier rib 12, a cutout portion 13 is provided through which the start point 11S side groove 11 and the end point 11E side groove 11 communicate with each other. The width of the cutout portion 13 may equal to that of the groove 11. In addition, the cutout portion 13 is formed to have a depth that is slightly shallower than that of the groove 11 and provides a gap between the cutout portion 13 and the tip end of a linear protrusion 21 formed to protrude on the second case 2 when the first case 1 and the second case 2 are bonded to each other. The depth of the cutout portion 13 will be described in detail below.

A plastic elastomer 3 that is cured after coating is disposed in the groove 11 provided in the first case 1. Here, a plastic elastomer 3 having fluidity is coated from the start point 11S side of the groove 11 to the end point 11E of the groove 11 by an injection apparatus to be described later, rather than inserting a linear elastic body that has been previously cured to have elasticity into the groove 11 provided in the first case 1. The plastic elastomer 3 coated in the groove 11 is cured within an extremely short time to become an elastic body. FIG. 1 illustrates a state in which the plastic elastomer cured after coating in the groove 11 is extracted from the groove 11 in which one end 3S is a coating start point and the other end 3E is a coating finish point. The coating start point and the coating finish point may be reversed.

Meanwhile, the annular bonding portion 2C of the second case 2 which is opposite to the annular bonding portion 1C of the first case 1 in the waterproofing case 10 is provided with a continuous linear protrusion 21 on the end surface 2T which is opposite to the groove 11. Accordingly, the end surface 2T is provided with an expanded portion 2W at a position which is opposite to the expanded portion 1W of the bonding portion 1C of the first case 1. The height of the linear protrusion 21 from the end surface 2T is determined such that, when the first case 1 and the second case 2 are bonded to each other, the tip end of the linear protrusion 21 does not arrive at the bottom of the groove 11 of the first case 1. In addition, the linear protrusion 21 protrudes from the end surface 2T such that the longitudinal center line of the tip end of the linear protrusion 21 coincides with the longitudinal center line of the groove 11 of the first case 1.

In addition, the width of the linear protrusion 21 is determined such that, when the first case 1 and the second case 2 are bonded to each other, the linear protrusion 21 is inserted into (stuck to) the exposed portion of the plastic elastomer 3 disposed in the groove 11 rather than pressing the exposed portion of the plastic elastomer 3 from the top. For this reason, when the first case 1 and the second case 2 are bonded to each other, the plastic elastomer 3 disposed within the groove 11 is bisected toward the opposite walls of the groove 11 by the linear protrusion 21.

Figure 3A:
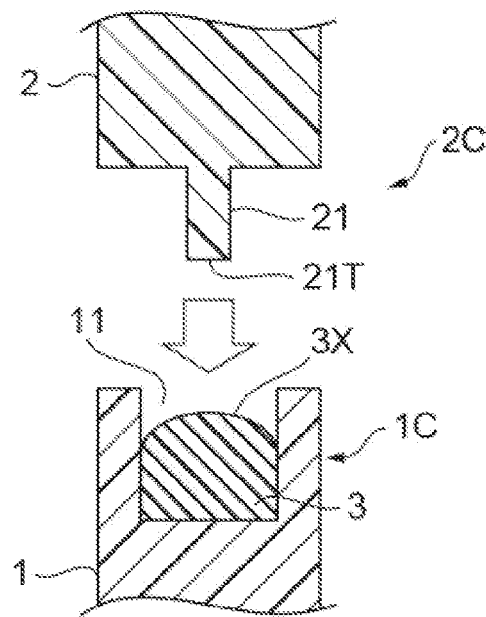
FIG. 3A is a partial enlarged cross-sectional view illustrating a state of bonding portions just before the second case is bonded to the first case in the first type waterproofing case.
Figure 3B:
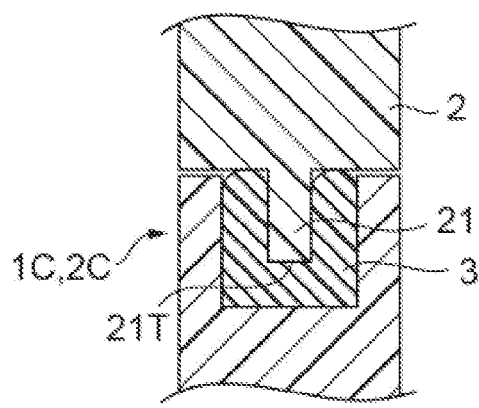
FIG. 3B is a partial enlarged cross-sectional view illustrating the state of the bonding portions after the second case is bonded to the first case from the state illustrated in FIG. 3A.

FIG. 3A illustrates the state of the bonding portions 1C, 2C just before the second case 2 is bonded to the first case 1 in which the plastic elastomer 3 is disposed within the groove 11 of the first case 1. The plastic elastomer 3 has an exposed portion 3X that is exposed from the groove 11. The width of the linear protrusion 21 is determined such that, when the end surface 2T of the linear protrusion 21 is urged against the exposed portion 3X of the plastic elastomer 3, the linear protrusion 3X is inserted into the plastic elastomer 3 rather than pressing the exposed portion 3T of the plastic elastomer 3 from the top. FIG. 3B illustrates the state of the bonding portions 1C, 2C after the second case 2 is bonded to the first case 1 after the state illustrated in FIG. 3A. As illustrated in FIG. 3B, when the first case 1 and the second case 2 are bonded to each other, the plastic elastomer 3 disposed within the groove 11 is bisected toward the opposite walls of the groove 11 by the linear protrusion 21.

The linear protrusion 21 is not provided to the position of the start point 11S of the groove 11 and the position of the end point 11E of the groove 11, and is continued by a crossing portion 21C that crosses the barrier rib 12 at the position of the cutout portion 13. In addition, when the first case 1 and the second case 2 are bonded to each other, the crossing portion 21C of the linear protrusion 21 presses the plastic elastomer 3 disposed in the opposite side grooves 11 of the cutout portion 13 of the barrier rib 12 at the position of the cutout portion 13, thereby press-bonding the start point 3S and the end point 3E of the plastic elastomer 3 to each another. As a result, the bonding portion 1C of the first case 1 and the bonding portion 2C of the second case 2 are water-proofed over the entire circumferences thereof by the plastic elastomer 3.

Figure 5A:
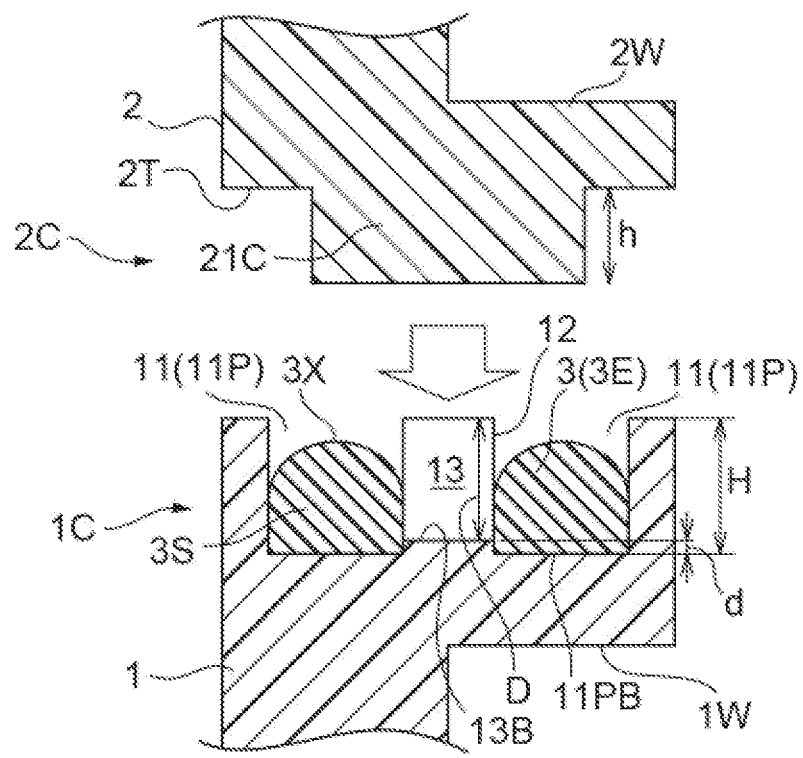
FIG. 5A is a partial enlarged cross-sectional view illustrating a state of a width expanded portion just before the second case is bonded to the first case in both of the first and second type waterproof cases and FIG. 5B is a partial enlarged cross-sectional view illustrating the state of the width expanded portion after the second case is bonded to the first case from the state illustrated in FIG. 5A.

FIG. 5A illustrates the state of the width expanded portions 1W, 2W of the first case 1 and the second case 2 just before the first case 1 and the second case 2 are bonded to each other. The cutout portion 13 is formed to have a depth D which is shallower than the depth H of the groove 11 and there is a level difference d between the bottom 11B of the groove 11 and the bottom 13B of the cutout portion 13. When the plastic elastomer 3 is coated at one side groove 11, the level difference d serves to suppress the plastic elastomer 3 from being introduced into the other side groove 11. In addition, the height h of the linear protrusion 21 from the end surface 2T is determined to be smaller than the depth of the groove 11 to the bottom 11B and also smaller than the depth D of the cutout portion 13 to the bottom 13B.

Figure 5B:
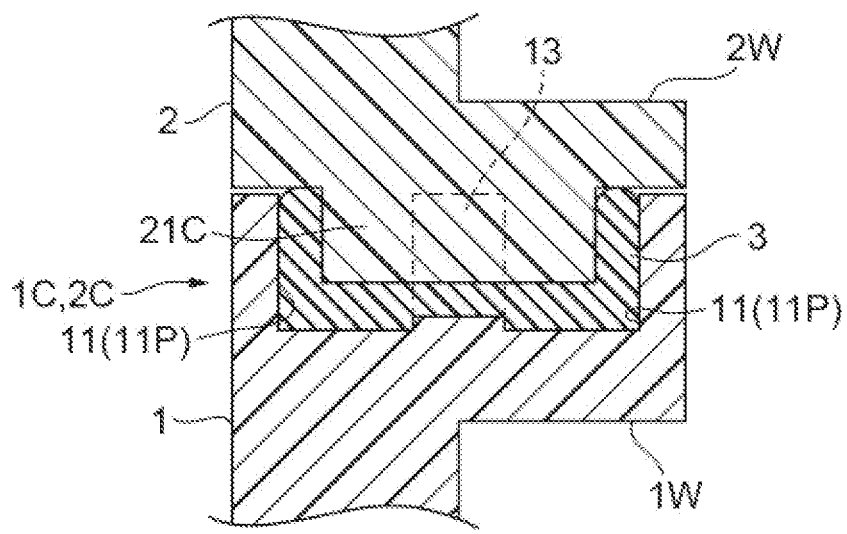

FIG. 5B illustrates the state of the expanded portions 1W, 2W of the first case 1 and the second case 2 after the second case 2 is bonded to the first case 1 from the state illustrated in FIG. 5A. When the first case 1 and the second case 2 are bonded to each other, the crossing portion 21C of the linear protrusion presses the plastic elastomer 3 disposed in the opposite side grooves 11 of the cutout portion 13 of the barrier rib 12 at the position of the cutout portion 13, thereby press-bonding the start point 3S and the end point 3E of the plastic elastomer 3 to each other. As a result, the bonding portion 1C of the first case 1 and the bonding portion 2C of the second case 2 are water-proofed over the entire circumferences thereof by the plastic elastomer 3.

Figure 2:
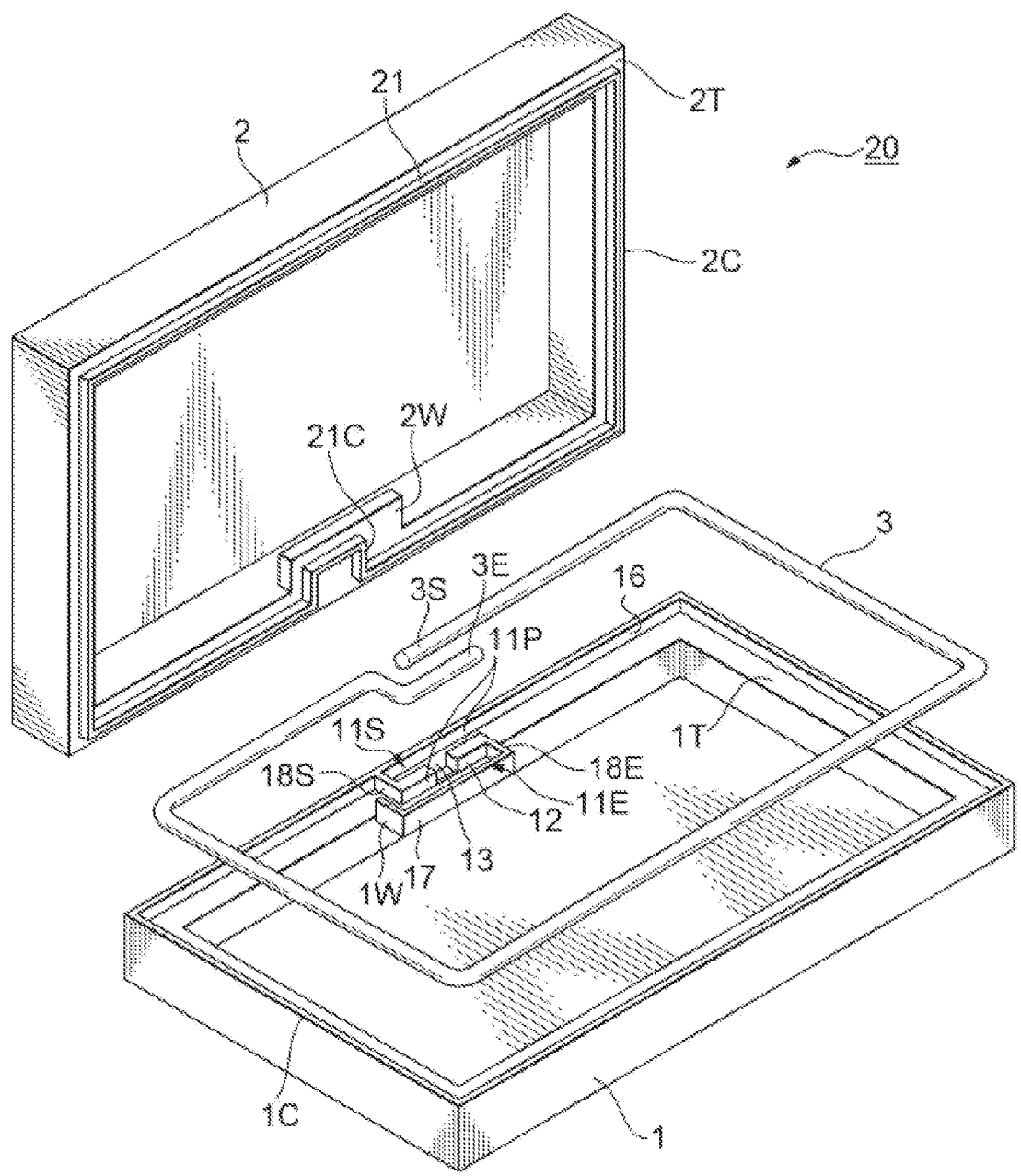
FIG. 2 is an exploded perspective view illustrating a second type waterproofing case according to the present disclosure.

FIG. 2 illustrates an embodiment for describing a water-proofing structure of the second type water proofing case 20 of the present disclosure. The same symbols are assigned for the constituent elements which are the same as those of the first type waterproofing case 10 illustrated in FIG. 1. In the embodiment illustrated in FIG. 2, the waterproofing structure portion is depicted in an enlarged size rather than in a practical size in order to describe the waterproofing structure of the second type waterproofing case 20. The second type waterproofing case 20 includes a first case 1 and a second case 2. The waterproofing case 20 is formed by fitting a bonding portion 1C of the first case 1 and a bonding portion 2C of the second case 2 to each other. In addition, the waterproofing structure of the waterproofing case 20 is provided at the bonding portion 1C of the first case 1 and the bonding portion 2C of the second case 2.

In the second type waterproofing case 20, the end surface 1T of the annular bonding portion 1C of the first case 1 is provided with an outer wall 16 over the entire circumference thereof. At a predetermined position of the inside of the outer wall 16, an expanded portion 1W is provided to make the width of the end surface 1T bulge to the inside. In addition, in the expanded portion 1W, parallel grooves 11P are formed by a barrier rib 12 and an inner wall 17 which have the same height as that of the outer wall 16. Although the lengths and widths of the barrier rib 12 and the inner wall 17 are not particularly limited, the lengths of the barrier rib 12 and the inner wall 17 are substantially the same since the parallel grooves 11P are formed. The parallel grooves 11P are closed at the ends thereof by end walls 18S, 18E at the positions where the adjacent relationship between the parallel groves 11P is terminated. Each of the parallel grooves 11P is connected to the end surface 1T of the first case 1 on the same plane at a side where the wall 18S or 18E is not provided. The expanded portion 1W may be provided at any position in the annular bonding portion C of the first case 1.

In the following description, the end wall 18S side of the second waterproofing case 20 will be referred to as the start point side of the end surface 1T, and the end wall 18E side will be referred to as the end point side of the end surface 1T. However, the start point and the end point are used for the convenience of description and any side of the end surfaces adjacent to the end walls 18S, 18E may be referred to as start point.

At a middle portion of the barrier rib 12, a cutout portion 13 is provided through which the parallel grooves 11P are communicated with each other. The width of the cutout portion 13 may be substantially the same as that of the parallel grooves 11P. In addition, the cutout portion 13 is formed to have a depth that is slightly shallower than that of the parallel grooves 11P but provides a gap between the cutout portion 13 and the tip end of the linear protrusion formed to protrude on the second case 2 when the first case 1 and the second case 2 are bonded to each other. The shape of the cutout portion 13 may be the same as that of the cutout portion 13 of the first embodiment.

In the second type waterproofing case 20, a plastic elastomer 3 is coated from, as a start point, the bottom 11PB adjacent to the end surface 18S in one parallel groove 11P provided with the end wall 18S to the end surface 1T continued thereto to be adjacent to the outer wall 16. The coating of the plastic elastomer 3 is continued to the bottom 11PB adjacent to the end wall 18E in the other parallel groove 11P. The coating of the plastic elastomer 3 on the end surface 1T may be performed by an injection apparatus to be described later. The plastic elastomer 3 having a fluidity and coated on the bottoms 11PB of the parallel grooves 11P and the end surface 1T is cured directly after the coating, thereby becoming an elastic body. FIG. 2 illustrates a state in which the plastic elastomer 3 is raised from the end surface 1T after the plastic elastomer 3 has been coated and cured on the end surface 1T. One end 3S is the coating start point and the other end 3E is the coating finish point. The coating start point and the coating finish point may be reversed.

The structure of the second case 2 provided with the boding portion 2C bonded to the annular bonding portion 1C of the first case 1 of the second type waterproofing case 20 may be the same as the structure of the second case of the first type waterproofing case 10 when the position where the width expanded portion 1W is provided and the shapes of the parallel grooves 11P are the same as those in the first type waterproofing case 10. Accordingly, the constituent elements in the structure of the second case 2 of the second type waterproofing case 20 are assigned with the same symbols as those of the same constituent elements in the second case 2 of the first waterproofing case 10 and the descriptions thereof will be omitted.

Figure 4A:
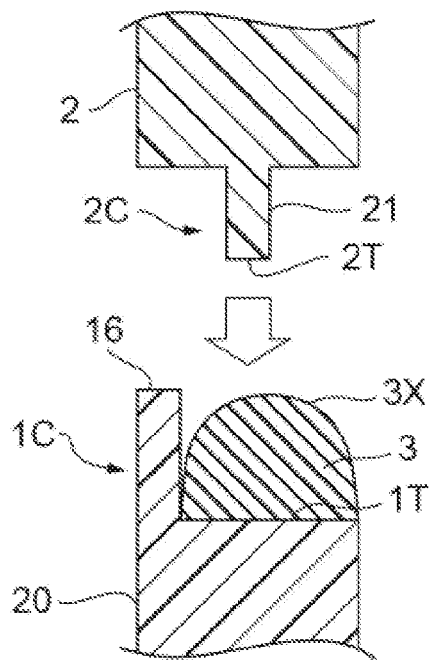
FIG. 4A is a partial enlarged cross-sectional view illustrating a state of bonding portions just before the second case is bonded to the first case in the second type waterproofing case and FIG. 4B is a partial enlarged cross-sectional view illustrating the state of the bonding portion after the second case is bonded to the first case from the state illustrated in FIG. 4A.
Figure 4B:
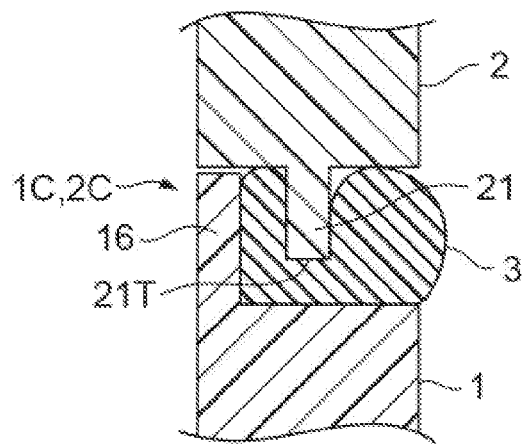

FIG. 4A illustrates the state of the bonding portions 1C, 2C just before the second case 2 is bonded to the first case 1. The plastic elastomer 3 is disposed on the end surface 1T adjacent to the outer wall 16 of the first case 1. The plastic elastomer 3 has an exposed portion 3X on the end surface 1T. The width of the linear protrusion 21 is determined such that, when the end surface 2T of the linear protrusion 21 is urged against the exposed portion 3X of the plastic elastomer 3 exposed portion 3X, the linear protrusion 21 is inserted into the plastic elastomer 3 rather than pressing the exposed portion 3T of the plastic elastomer 3 from the top. FIG. 4B illustrates a state of the bending portions 1C, 2C after the second case 2 is bonded to the first case 1 from the state illustrated in FIG. 4A. As illustrated in FIG. 4B, when the first case 1 and the second case 2 are bonded to each other, the plastic elastomer 3 disposed on the end surface 1T is bisected into the outer wall 16 side portion and the inner side portion of the first case 1 by the linear protrusion 21.

In the second type waterproofing case 20, the pressing operation of the plastic elastomer 3 and the pressure-bending operation of the start point 3S and the end point 3E of the plastic elastomer 3 by the crossing portion 21C that crosses the barrier rib 12 provided on the linear protrusion 21, are the same as the operations in the first type waterproofing case 10. As a result, also in the second type waterproofing case 20, the bonding portion 1C of the first case 1 and the bonding portion 2C of the second case 2 are water-proofed over the entire circumferences thereof by the plastic elastomer 3.

FIGS. 6A to 6F illustrate other embodiments of the shapes of the groove 11 formed at the bonding portion 1C of the first waterproofing case 10. The cross-sectional shape of the groove 11 illustrated in FIGS. 3A and 3B is a rectangular shape. Meanwhile, in the second embodiment of the cross-section of the groove 11 illustrated in FIG. 6A, the side surfaces and the bottom 11B of the groove 11 are connected at the curved surfaces 15. In addition, in the third embodiment of the cross-sectional shape of the groove 11 illustrated in FIG. 6B, the entire bottom of the groove 11 is formed in a curved surface 24. Further, in the fourth embodiment of the cross-sectional view of the groove 11 illustrated in FIG. 6C, the entire bottom of the groove 11 is formed in a circumferential surface 25.

Figure 6A:
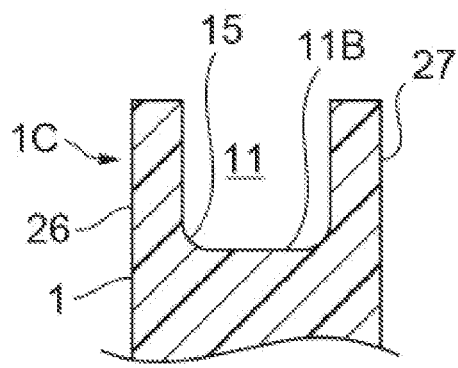
FIGS. 6A to 6F are views illustrating embodiments of shapes of the groove formed at the bonding portion of the first case of the first type waterproofing case. In particular.
Figure 6B:
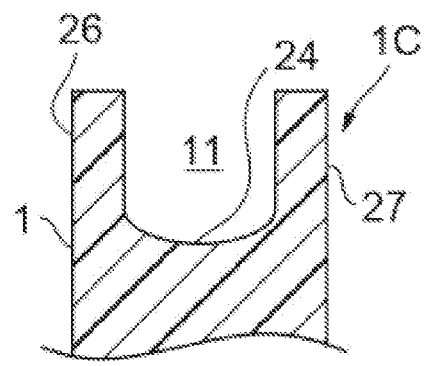
Figure 6C:
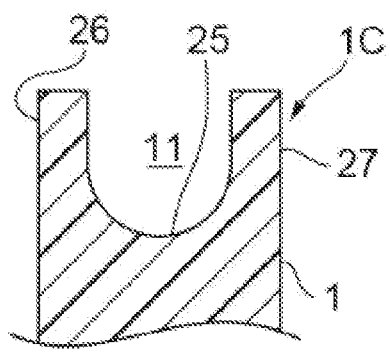
Figure 6D:
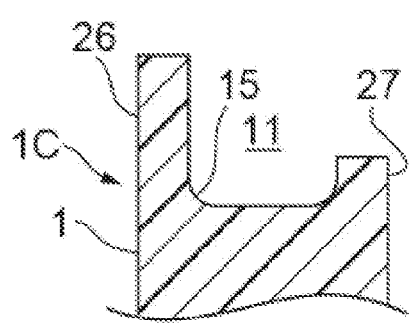
Figure 6E:
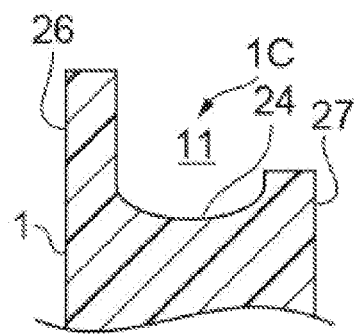
Figure 6F:
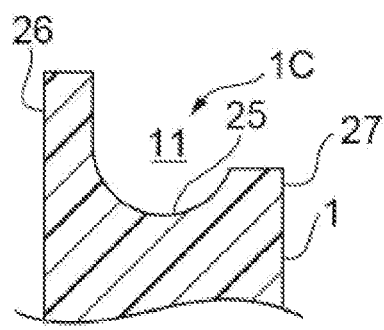

The groove 11 formed at the bonding portion 1C of the first type waterproofing case 10 includes an outer wall 26 and the inner wall 27, and the heights of the outer wall 26 and the inner wall 27 may not be equal to each other. FIG. 6D illustrates a modified embodiment in which the inner wall 27 of the groove 11 of the second embodiment illustrated in FIG. 6A is formed to be lower than the outer wall 26. In addition, FIG. 6E illustrates a modified embodiment in which the inner wall 27 of the groove 11 of the third embodiment illustrated in FIG. 6E is formed to be lower than the outer wall 26. Further, FIG. 6F illustrates a modified embodiment in which the inner wall 27 of the groove 11 of the fourth embodiment illustrated in FIG. 6C is formed to be lower than the outer wall 26.

Figure 7A:
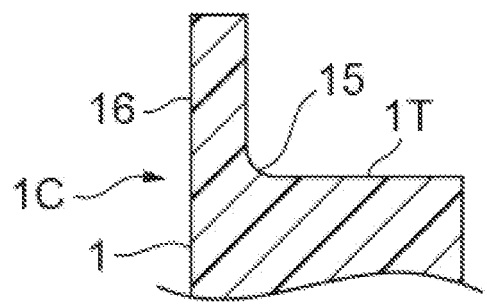
FIGS. 7A to 7C are views illustrating embodiments of shapes of grooves formed at the bonding portion of the first case of the second type waterproofing case. In particular.
Figure 7B:
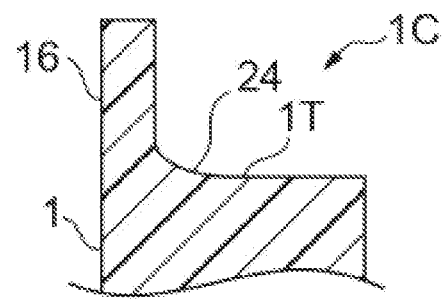
Figure 7C:
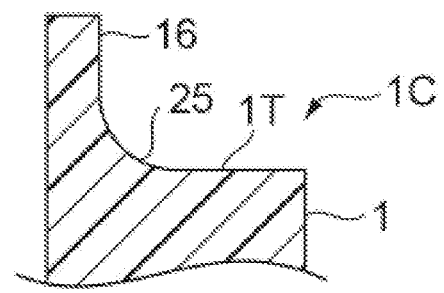

FIGS. 7A to 7C illustrate other embodiments of the shape of the end surface 1T of the bonding portion 1C of the second type waterproofing case 20. In the second embodiment of the cross-sectional shape of the end surface 1T illustrated in FIG. 7A, the inner circumferential surface of the outer wall 16 of the bonding portion 1C and the end surface 1T are connected at a curved surface 15. In the third embodiment of the cross-sectional shape of the end surface 1T illustrated in FIG. 7B, the end surface 1T of the bonding portion 1C is formed in a curved surface 24. Further, in the fourth embodiment of the cross-sectional shape of the end surface 1T illustrated in FIG. 7C, the inner circumferential surface of the outer wall 16 and the end surface 1T are connected at a circumferential surface 25. The shapes of the groove 11 and the end surface 1T are not limited to these embodiments.

Figure 8A:
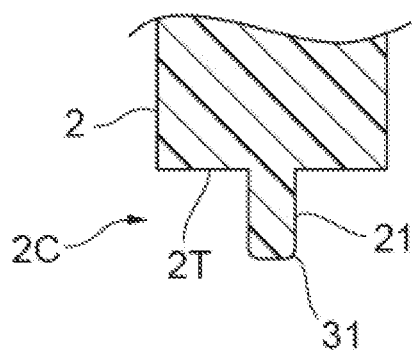
FIG. 8A is a partial enlarged cross-sectional view illustrating a second embodiment of the bonding portion of the second case.
Figure 8B:
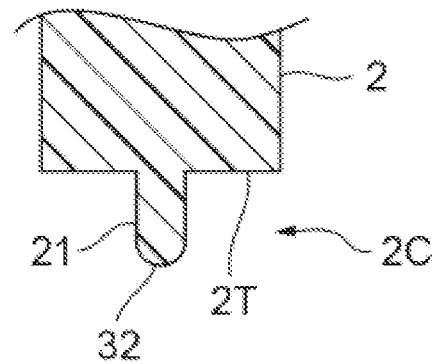
FIG. 8B is a partial enlarged cross-sectional view illustrating a third embodiment of the bonding portion of the second case.
Figure 8C:
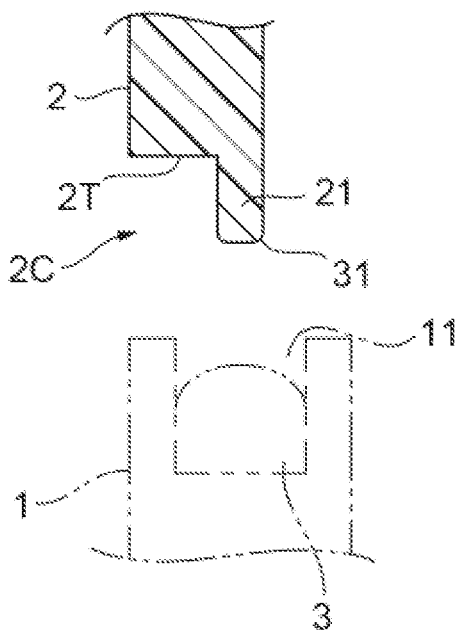
FIG. 8C is a partial enlarged cross-sectional view illustrating a fourth embodiment of the bonding portion of the second case.
Figure 8D:
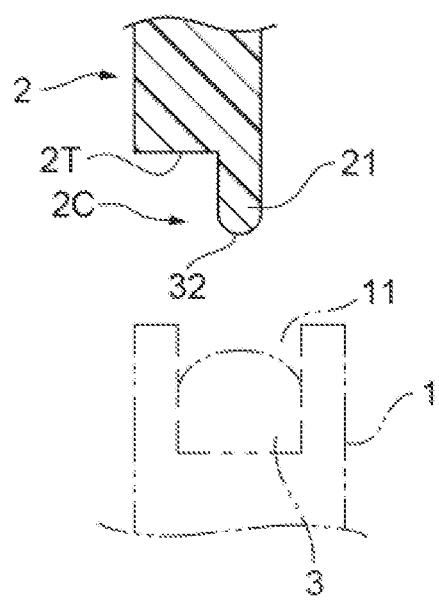
FIG. 8D is a partial enlarged cross-sectional view illustrating a fifth embodiment of the bonding portion of the second case.

FIG. 8A illustrates a shape of a second embodiment of the linear protrusion 21 provided on the bonding portion 2C of the second case 2, and FIG. 8B illustrates a third embodiment of the linear protrusion 21. The linear protrusion 21 provided on the bonding portion 2C of the second case 2 illustrated in FIGS. 3 and 4 has a cross-section of a rectangular shape. Meanwhile, in the second embodiment illustrated in FIG. 8A, curved surfaces 31 are provided at the opposite side of the tip end of the linear protrusion 21. In addition, in the third embodiment illustrated in FIG. 8B, the tip end of the linear protrusion 21 is formed in a circumferential surface 32. Further, as in the fourth and fifth embodiments as illustrated in FIGS. 8C and 8D, the thickness of the second case may be further slimmed by cutting the inner portion of the linear protrusion 21 of the second case of the second or third embodiment.

Figure 9:
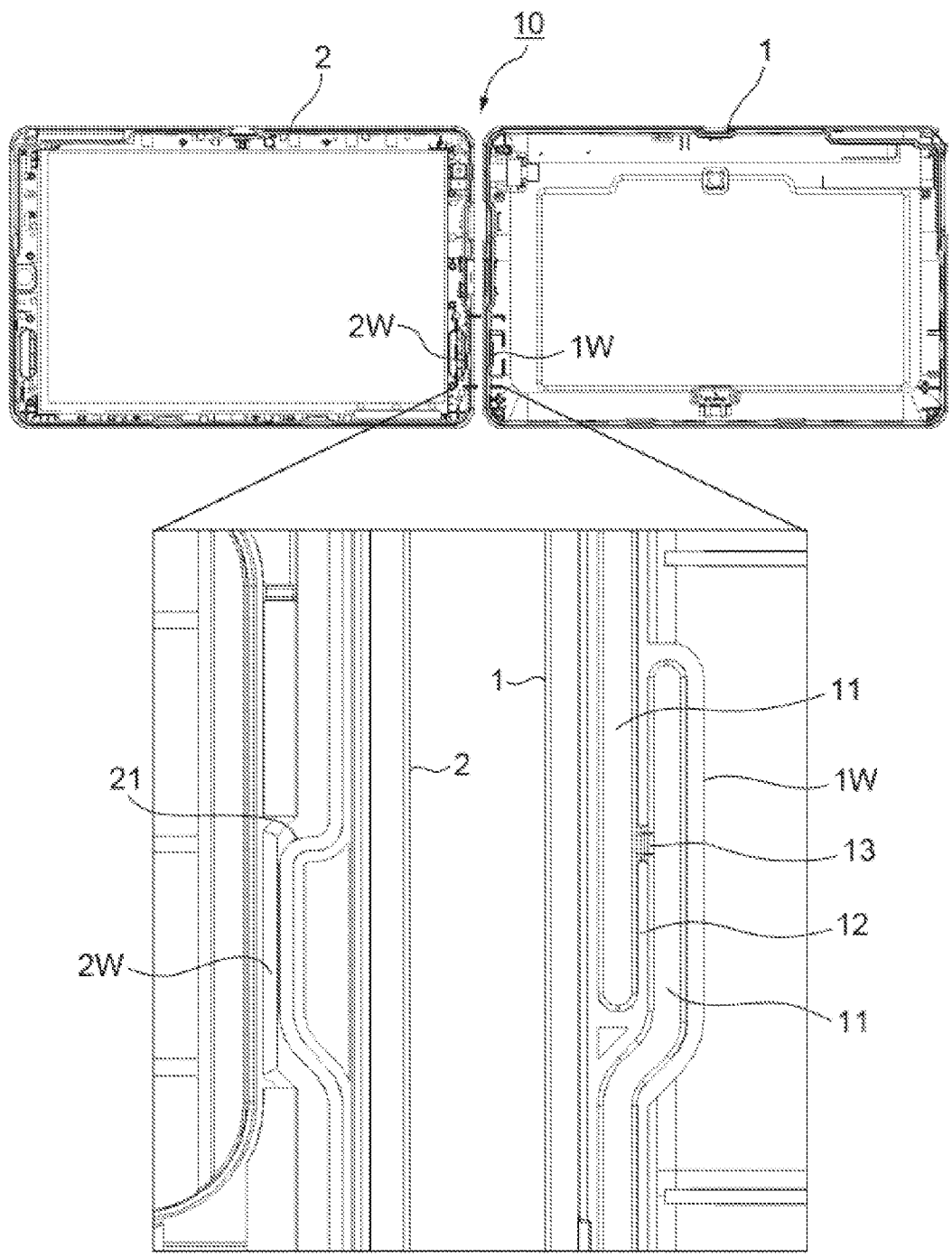
FIG. 9 is a development view and a partial enlarged view thereof illustrating a specific embodiment of the first type waterproofing case according to the present disclosure.

FIG. 9 illustrates a development view and a partial enlarged view of a specific embodiment of the first type waterproofing case 10 according to the present disclosure. In the drawing, the constituent elements which are the same as those of the first type waterproofing case 10 set forth above are assigned with the same symbols. In the present embodiment, the expanded portion 1W of the first case 1 and the expanded portion 2W of the second case 2 are provided at a short side of the waterproofing case 10. In addition, the length of the expanded portion 2W provided in the second case 2 is shorter than the length of the expanded portion 1W provided in the first case 1. Further, no expanded portion 2W is provided at a portion where it is not required to provide the linear protrusion 21, thereby suppressing a waste of material.

Figure 10:
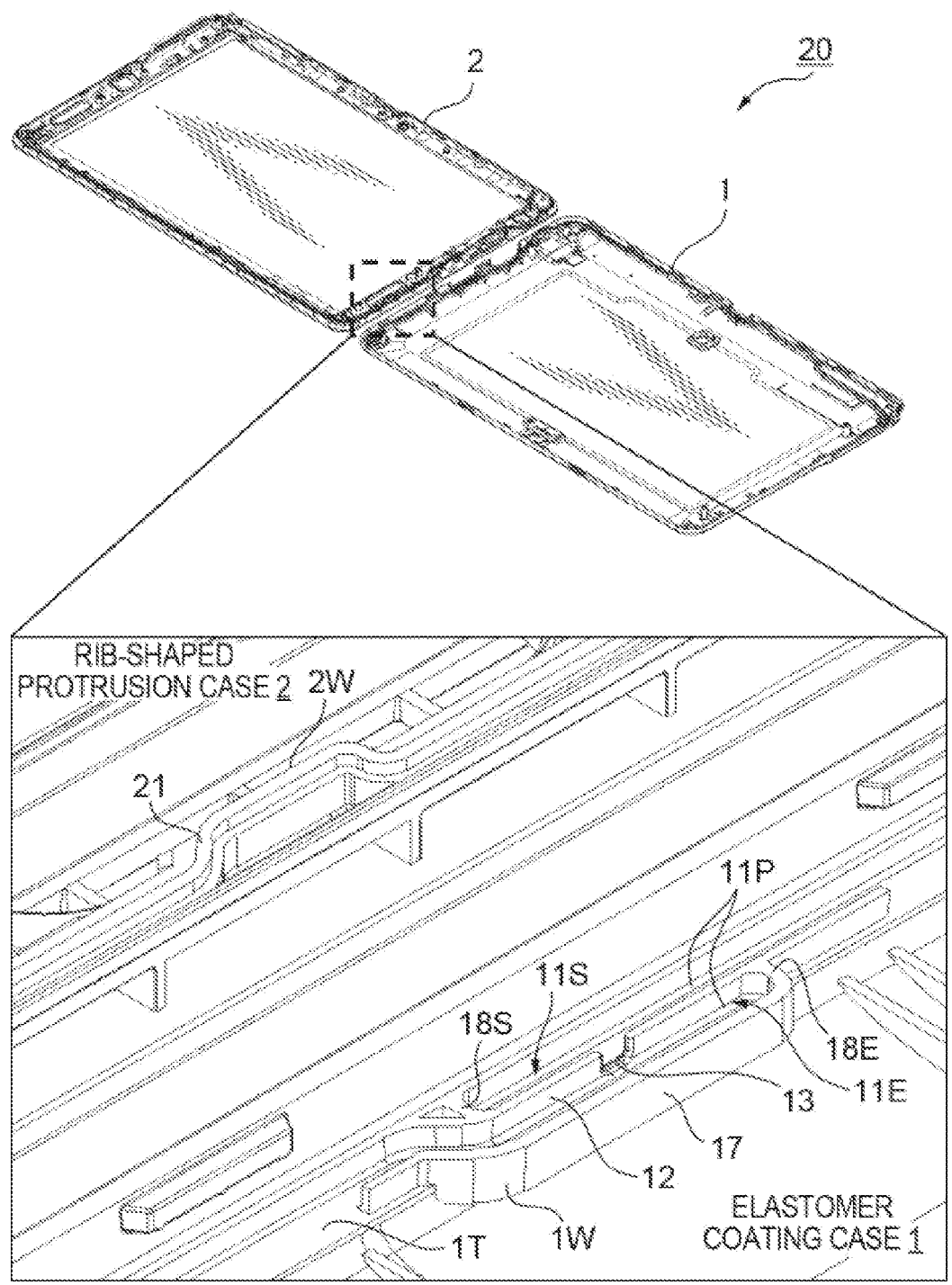
FIG. 10 is a development view and a partial enlarged view thereof illustrating a specific embodiment of the second type waterproofing case according to the present disclosure.

FIG. 10 is a development view and a partial enlarged view thereof illustrating a specific embodiment of the second type waterproofing case according to the present disclosure. FIG. 10 illustrates feasible shapes of the parallel grooves 11P, the barrier rib 12, the cutout portion 13, the inner wall 17, and the end walls 18S, 18E on the expanded portion 1W provided in the first case 1 (in FIG. 10, indicated as "elastomer coated case"), and feasible shapes of the linear protrusion 21 joined on the expanded portion 2W provided in the second case 2 (in FIG. 10, indicated as "rib-shaped protrusion case 2").

Figure 11A:
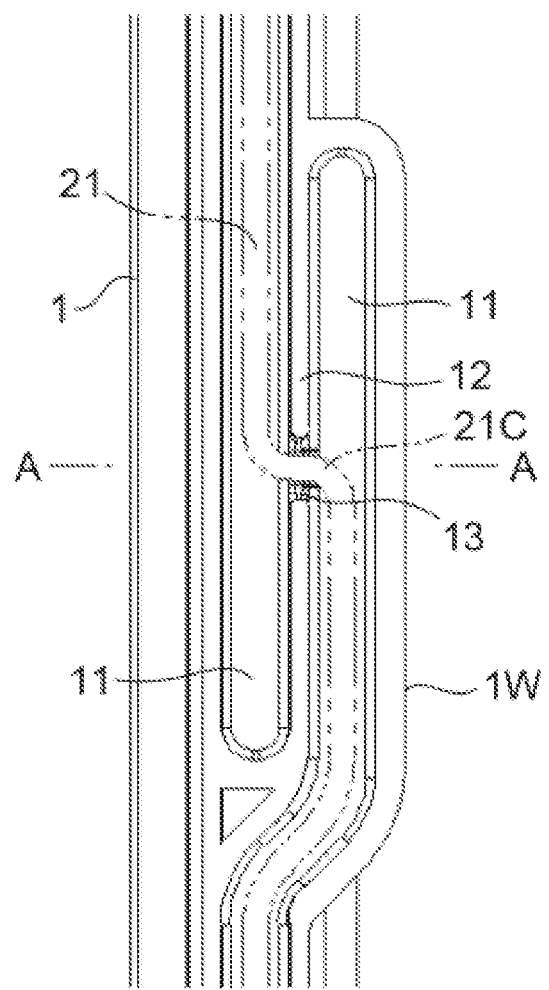
FIG. 11A is a partial enlarged view illustrating a state in which the linear protrusion of the second case is overlapped over parallel groove portions of the first case illustrated in FIG. 9.
Figure 11B:
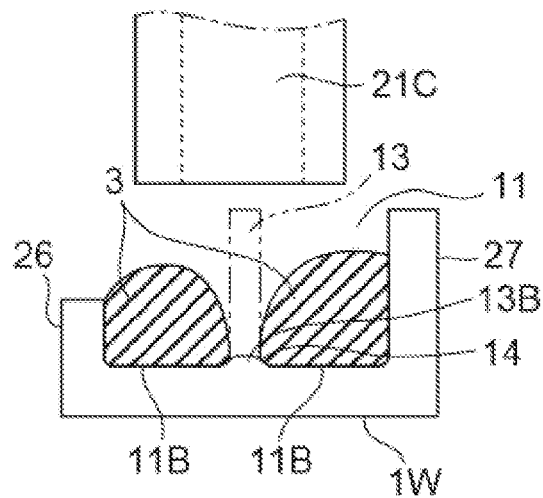
FIG. 11B is a cross-sectional view taken along line A-A in FIG. 11A before the second case is coupled to the first case.

FIG. 11A illustrates the state in which the linear protrusion 21 of the second case 2 (depicted by alternate long and two short dashes lines) is overlapped on the parallel grooves 11 of the first case 1 illustrated in FIG. 9 in an enlarged scale. In addition, FIG. 11B is a cross-sectional view taken along line A-A in FIG. 11A before the second case 2 is coupled to the first case 1. In the present embodiment, steps between the bottom 13B of the cutout portion 13 and the bottom 11B of groove 11 are formed at the curved surface 14. Further, the height of the inner wall 27 provided in the expanded portion 1W of the case 1 is higher than the height of the outer wall 26 of the groove 11. Further, FIG. 11C illustrates a cross-section taken along line A-A in FIG. A after the second case 2 is bonded to the first case 1.

Figure 11C:
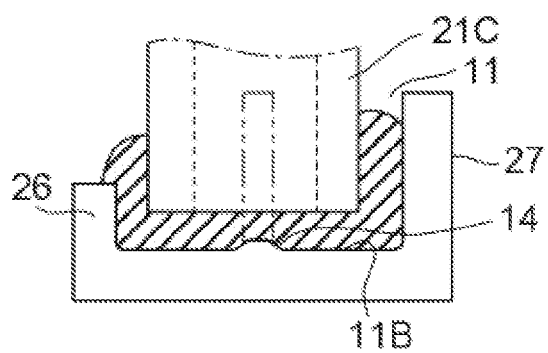
FIG. 11C is a cross-sectional view taken along line A-A in FIG. 11A after the second case is bonded to the first case.
Figure 11D:
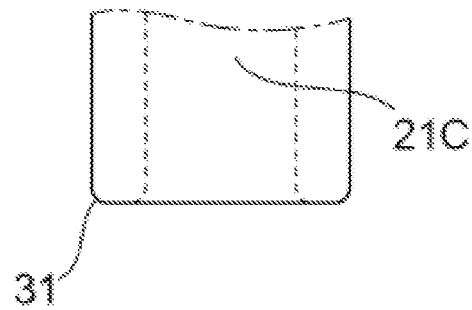
FIG. 11D is a partial view illustrating the shape of a second embodiment of the linear protrusion illustrated in FIG. 11C.
Figure 11E:
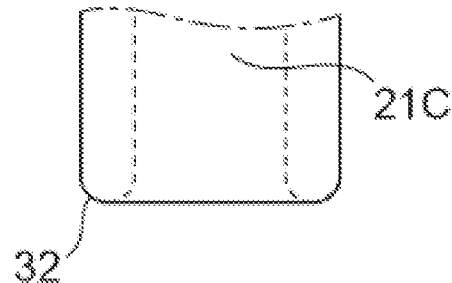
FIG. 11E is a partial view illustrating the shape of a third embodiment of the linear protrusion illustrated in FIG. 11C.

FIG. 11D illustrates the shape of the second embodiment of the crossing portion 21C of the linear protrusion 21 illustrated in FIG. 11C in which the shape of the crossing portion 21C of the linear protrusion 21 in the case when the curved surface 31 illustrated in FIG. 8A is formed at the tip end of the linear protrusion 21, is illustrated. In addition, FIG. 11E illustrates the shape of the third embodiment of the crossing portion 21C of the linear protrusion 21 illustrated in FIG. 11C in which the shape of the crossing portion 21C of the linear protrusion 21 in the case where the circumferential surface 32 illustrated in FIG. 8B is formed at the tip end f the linear protrusion 21 is illustrated.

Figure 12:
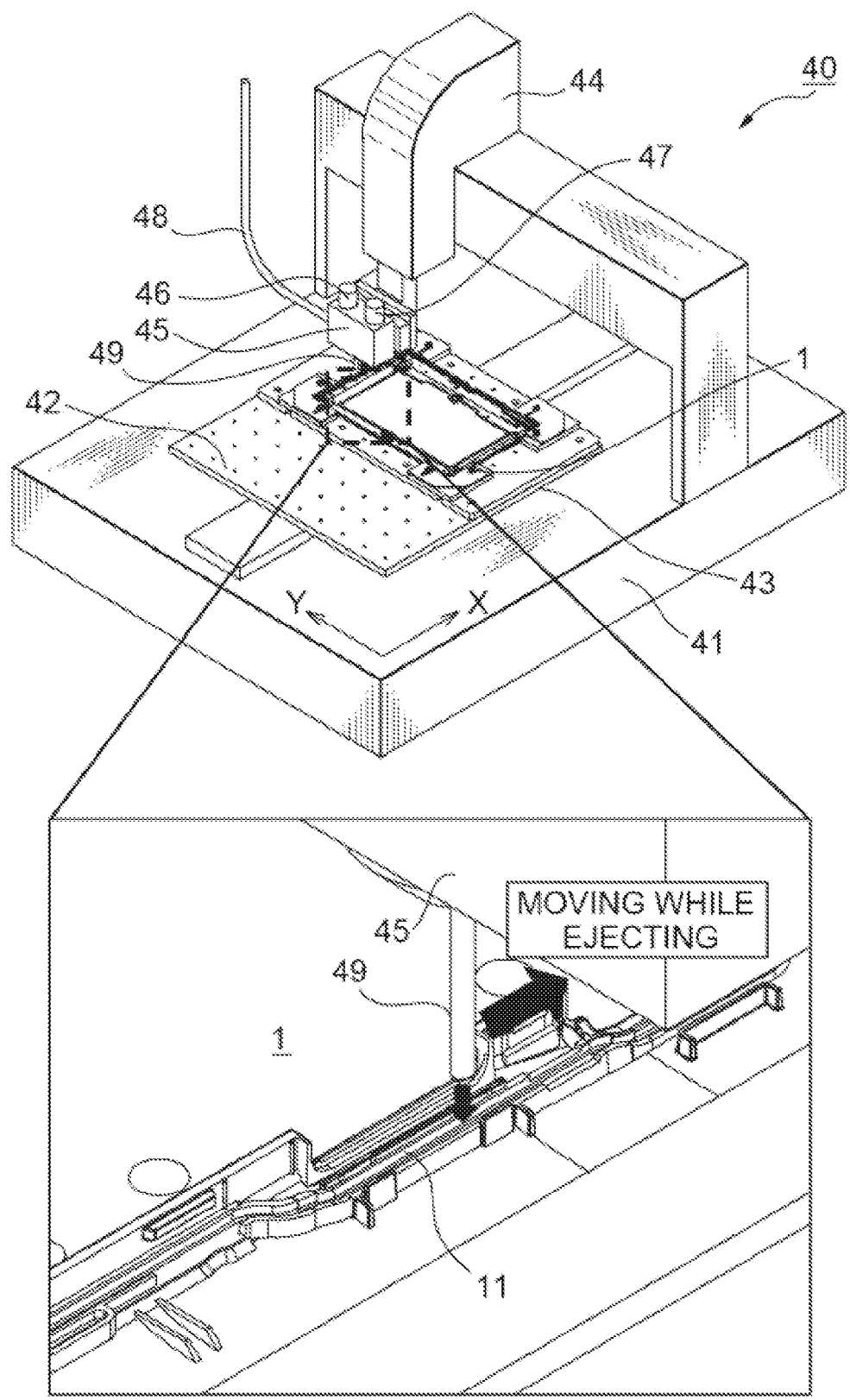
FIG. 12 is a perspective view illustrating a coating apparatus of an embodiment that coats an elastomer on the first case illustrated in FIG. 9.

FIG. 12 illustrates a coating apparatus 40 according to an embodiment which is configured to coat an elastomer on the first case 1 illustrated in FIG. 9. The coating apparatus 40 is provided with a movable table 42 above a base 41, and the first case 1 is attached on the movable table 42 through a jig 43. The movable table 42 is configured to be capable of moving the first case 1 in the X-direction. A head moving unit 44 configured to be capable of moving a coating head 45 in the Y-direction is provided above the base 41. The head moving unit 44 is provided with the head 45 that is opposite to the first case 1 disposed on the movable table 41 and a nozzle 49 configured to eject a plastic elastomer is installed in front of the head 45. The coating apparatus 40 of the present embodiment is a two liquid mixing type. A cartridge 46 configured to store a main agent and a cartridge 47 configured to store a curing agent are incorporated in the head 45 so that, when compressed air is introduced from an air tube 48, the main agent and the curing agent are mixed and injected from the nozzle 49.

In the coating apparatus 40 of the present embodiment, the nozzle 49 may be moved along the shape of the groove 11 provided along the peripheral edge of the first case 1 by the operations of the movable table 42 and the head moving unit 44. Accordingly, the head 45 starts movement at the start point of the groove 11 as described above and moves to the end point of the groove along the groove during which a plastic elastomer in which a main agent and a curing agent are mixed is ejected to the groove 11 from the nozzle to be coated within the groove 11. By the coating apparatus, the plastic elastomer is uniformly coated within the groove 11 of the first case 1. A control unit of the coating apparatus 40 is omitted in FIG. 12.

Figure 13:
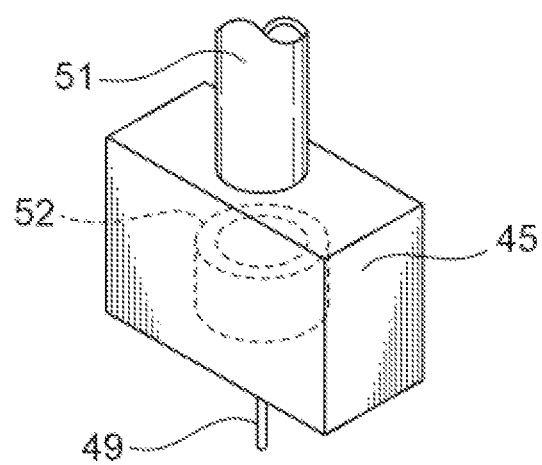
FIG. 13 is a perspective view illustrating another embodiment of a head and a nozzle unit of the elastomer coating apparatus illustrated in FIG. 12.

The coating apparatus 40 as described above is configured to cure the plastic elastomer after coating by mixing a main agent and a curing agent. However, a coating apparatus that is configured to coat a heated plastic elastomer in the groove 11 of the first case 1 and reduce the temperature after coating so as to cure the plastic elastomer, may also be used. FIG. 13 illustrates only a head and a nozzle section of another embodiment of the coating apparatus. In this embodiment, a plastic elastomer is supplied to the head 45 through an elastomer supply hose 51, heated by a heater 52 installed within the head 45, and ejected from the nozzle 49. The heating temperature is about 200° C. Since the construction of the coating apparatus is the same as the two liquid mixing type coating apparatus except for the head 45 section, descriptions thereof will be omitted.

Here, the plastic elastomer coated in the groove of the first case will be described. The plastic elastomer which may be used for the waterproofing case of the present disclosure may be any elastomer that may be cured after being coated in the groove to form an elastic body. The following kinds may be considered.

(1) a mixing type plastic elastomer which is initially in a liquid phase and is converted into an elastic body by mixing a component thereto before and after coating, (2) a thermoplastic elastomer which is initially in an elastic solid phase and is converted into a liquid phase by being heated and then converted into an elastic body by being cooled after coating, (3) a moisture-curable plastic elastomer which is initially in a liquid phase and is converted into an elastic body by reacting with moisture in the air after coating, (4) a photo-curable plastic elastomer which is initially in a liquid phase and is converted into an elastic body by reacting with light, for example, ultraviolet rays, irradiated after coating, and (5) a heating-reactive plastic elastomer which is initially in a liquid phase and is converted into an elastic body by reacting with heating after coating.

As described above, according to a waterproofing case and a method of manufacturing the waterproofing case of the present application, an excellent waterproofing effect may be obtained because a mold for a waterproofing gasket may not be required, a job of attaching the waterproofing gasket may not occur, and the reaction force is substantially uniform from the start point to the end point of the elastic body. In addition, since the waterproofing elastic body does not stick out of a case, the external appearance of the case is improved and the deformation of the case due to the increase of reaction force is not caused. Moreover, the start point and the end point of the elastic body may be freely set in consideration of a mounting space, and the miniaturization and slimming down of the case may be facilitated. Further, by providing a non-annular groove, the shape of the elastic body may be controlled at the start point and the end point of the elastic body. As compared with an annular groove in which the start point and the end point overlap with each other, the elastic body may exhibit a reliable waterproofing performance since the shape and overlapping state do not change. Further, since waterproofing is achieved by inserting the linear protrusion into the elastic body rather than simply pressing the elastic body, a reliable sealing may be ensured without being substantially affected by a gap which may occur due to the variation in size and assembly of the elastic body. Consequently, there is also a merit in manufacturing condition.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiments of the present disclosure have been described in detail, it should be understood that the various changes, substitutions, and alterations could be made hereto without departing from the spirit and scope of the disclosure.

What is claimed is:

1. A waterproofing case that has a first case and a second case each including an annular bonding portion, the waterproofing case comprising:
    a non-annular groove, located in one of annular bonding portions of the first case and the second case, that has a start point side and an end point side arranged in parallel by a barrier rib of a certain length, wherein the barrier rib is arranged in parallel to the start point side and in parallel to the end point side;
    a cutout portion that is provided at a middle portion of the barrier rib so as to allow a groove portion at the start point side and a groove portion at the end point side to communicate with each other;
    a plastic elastomer that is disposed within the non-annular groove by curing after being coated, wherein the plastic elastomer has a first distinct free end at the start point side of the non-annular groove, and the plastic elastomer has a second distinct free end at the end point side of the non-annular groove; and
    a protrusion, located in the other annular bonding portion of the first case or the second case, that does not arrive at a bottom of the non-annular groove and bisects an exposed portion of the plastic elastomer disposed within the non-annular groove, moving the plastic elastomer toward opposite walls of the non-annular groove when the first case and the second case are bonded to each other,
    wherein the protrusion is continued to cross the barrier rib at a position of the cutout portion.

2. The waterproofing case according to claim 1, wherein a width and height of the protrusion are uniform over the entire perimeter thereof, and a bottom of the cutout portion has a depth that produces a gap between a position of a tip end of the protrusion and the bottom of the cutout portion and is positioned higher than the bottom of the non-annular groove.

3. The waterproofing case according to claim 2, wherein the bottom of the cutout portion and the bottom of the non-annular groove are continued by a curved surface.

4. The waterproofing case according to claim 1, wherein the non-annular groove has a rectangular cross-sectional shape.

5. The waterproofing case according to claim 4, wherein the bottom and walls of the non-annular groove are connected at curved surfaces.

6. The waterproofing case according to claim 1, wherein a tip end of the protrusion has a rectangular cross-sectional shape.

7. The waterproofing case according to claim 1, wherein a tip end of the protrusion has a curved cross-sectional shape.

8. The waterproofing case according to claim 1, wherein one of the start point side and the end point side of the non-annular groove is positioned inside of the waterproofing case.

9. A waterproofing case that has a first case and a second case each including an annular bonding portion, the waterproofing case comprising:
    an outer wall, located in an end surface of one of the annular bonding portions of the first case and the second case, that is provided with a certain height over the entire perimeter thereof;
    parallel grooves that are formed at a certain position inside the outer wall by a barrier rib and an inner wall which have the same height as the outer wall, wherein the barrier rib is arranged in parallel to the parallel grooves;
    a cutout portion provided at a middle portion of the barrier rib so as to allow one of the parallel grooves to communicate with the other parallel groove, the parallel grooves being closed by end wall positions where an adjacent relationship there-between is terminated, respectively;
    a plastic elastomer that is cured after coating is disposed on an inner end surface of and bottoms of the parallel grooves using one end wall of the parallel grooves as a start point and other end wall as an end point, wherein the plastic elastomer has a first distinct free end at one end of one parallel groove, and the plastic elastomer has a second distinct free end at an end of another parallel groove; and
    a linear protrusion, located in an end surface of the annular bonding portion of the other first case and the second case, that when the first case and the second case are bonded to each other, does not arrive at the end surface adjacent to the end wall and longitudinally bisects an exposed portion of the plastic elastomer,
    wherein the linear protrusion is continued to cross the barrier rib at the position of the cutout portion.

10. The waterproofing case according to claim 1, wherein the plastic elastomer is converted into a liquid phase to have a high fluidity when heated before coating, and cured to an elastic body that has adhesiveness, and does not flow when cooled to a temperature not higher than a melting point thereof.

11. The waterproofing case according to claim 1, wherein the plastic elastomer is in a liquid phase before coating and is cured to an elastic body which has adhesiveness, and does not flow after coating when a plurality of components are mixed thereto during coating.

12. The waterproofing case according to claim 1, wherein the plastic elastomer is in a liquid phase before coating and is converted into an elastic body by reacting with moisture in the air after coating.

13. The waterproofing case according to claim 1, wherein the plastic elastomer is in a liquid phase before coating and is converted into an elastic body by reacting with light such as ultraviolet rays irradiated after coating.

14. The waterproofing case according to claim 1, wherein the plastic elastomer is in a liquid phase before coating and is converted into an elastic body by reacting with heat applied after coating.

15. A method of manufacturing a waterproofing case, comprising:
    providing a first case and a second case each including an annular bonding portion;
    providing a non-annular groove, in one of annular bonding portions of the first case and the second case, having a start point side groove and an end point side groove;
    wherein the start point side groove and the end point side groove are provided in parallel to each other by a barrier rib having a certain length, and the barrier rib is arranged in parallel to the start point side groove and in parallel to the end point side groove;

providing a cutout portion at a middle portion of the barrier rib to allow the start point side groove and the end point side groove to communicate with each other; and providing, on the annular bonding portions of the other of the first case and the second case, a linear protrusion that does not arrive at an end surface adjacent to an end wall and longitudinally bisects an exposed portion of a plastic elastomer disposed within the non-annular groove when the first case and the second case are bonded to each other, wherein the plastic elastomer has a first distinct free end at the start point side groove, and the plastic elastomer has a second distinct free end of the end point side groove, wherein the linear protrusion is continued to cross the barrier rib at the position of the cutout portion and the plastic elastomer is cured after coating to have elasticity.

* * * * *